United States Patent
Dharne et al.

(10) Patent No.: US 6,954,100 B2
(45) Date of Patent: Oct. 11, 2005

(54) LEVEL SHIFTER

(75) Inventors: Shivraj G. Dharne, Noida (IN); Shahid Ali, New Delhi (IN); Christopher K. Y. Chun, Austin, TX (US); Claude Moughanni, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/660,847

(22) Filed: Sep. 12, 2003

(65) Prior Publication Data

US 2005/0057296 A1 Mar. 17, 2005

(51) Int. Cl.⁷ .............................................. H03L 5/00
(52) U.S. Cl. ...................................... 327/333; 326/80
(58) Field of Search .................. 327/333, 318–319, 327/306, 427; 326/63, 68, 80

(56) References Cited

U.S. PATENT DOCUMENTS

| | | | |
|---|---|---|---|
| 4,150,308 A | | 4/1979 | Adlhoch |
| 4,429,409 A | * | 1/1984 | Berry et al. .................. 378/45 |
| 5,455,526 A | * | 10/1995 | Runas ......................... 326/81 |
| 6,005,415 A | * | 12/1999 | Solomon ...................... 326/83 |
| 6,507,506 B1 | * | 1/2003 | Pinas et al. .................... 363/79 |
| 6,512,401 B2 | | 1/2003 | Clark et al. |
| 6,556,061 B1 | | 4/2003 | Chen et al. |
| 6,600,679 B2 | | 7/2003 | Tanzawa et al. |
| 6,717,434 B2 | * | 4/2004 | Takahashi et al. ............ 326/37 |
| 2003/0001655 A1 | | 1/2003 | Jeong |
| 2003/0098711 A1 | | 5/2003 | Tsuboi et al. |
| 2003/0112041 A1 | | 6/2003 | Clark et al. |
| 2003/0117207 A1 | | 6/2003 | Suk et al. |
| 2004/0052249 A1 | * | 3/2004 | Fukuoka et al. ............ 370/362 |

FOREIGN PATENT DOCUMENTS

| | | | |
|---|---|---|---|
| EP | 0 608 489 B1 | 12/1997 | |
| EP | 1 191 694 A1 | 3/2002 | |
| JP | 2003188710 A | * 7/2003 | ......... H03K/1/0185 |

* cited by examiner

Primary Examiner—Timothy P. Callahan
Assistant Examiner—Cassandra Cox
(74) Attorney, Agent, or Firm—David G. Dolezal; Micahel Balconi-Lamica

(57) ABSTRACT

A level shifter for an integrated circuit. In one embodiment, the level shifter is a bi-directional level shifter with a signal terminal located in each voltage domain that can be utilized as input or output terminal. In some embodiments, the level shifter includes transistors for cutting off the flow of current between domain power supplies when the input terminals are at a particular state. In one embodiment, only one signal line of the level shifter crosses a domain boundary.

21 Claims, 4 Drawing Sheets

LEVEL SHIFTER

BACKGROUND OF THE INVENTION

1. Field of the Invention

This invention relates in general to integrated circuits and specifically to level shifters for integrated circuits.

2. Description of the Related Art

Level shifters are utilized in integrated circuits for changing the voltage of a signal from a first voltage to a second voltage.

FIG. 1 is a circuit diagram of a prior art level shifter. Level shifter 101 includes circuitry located in a voltage domain 1 (Domain 1) of an integrated circuit and circuitry located in a voltage domain 2 (Domain 2) of an integrated circuit. A voltage domain is a portion of an integrated circuit that is operable at a given supply voltage. A inverter 119 is located in Domain 1. N type field effect transistors (NFETs) 117 an 115 and P-type field effect transistors (PFETs) 111 and 113 are located in Domain 2. Inverter 119 includes a power supply terminal coupled to a Domain 1 voltage supply rail 109 (at voltage VDD1). A source/drain terminal (a current terminal of a FET) of PFET 111 and a source/drain terminal of PFET 113 are connected to Domain 2 voltage supply rail 107 (at voltage VDD2).

A high voltage (e.g. VDD1) at input terminal 103 makes NFET 117 conductive and pulls the output of inverter 119 to VSS. The output of inverter 119 being at VSS makes NFET 115 non conductive. Making NFET 117 conductive pulls the gate terminal (the control terminal of a FET) of PFET 113 to VSS making PFET 113 conductive. Making PFET 113 conductive pulls output terminal 105 to VDD2 thereby making PFET 111 non conductive. Accordingly, a change to a high voltage of VDD1 at terminal 103 corresponds to a change to high voltage of VDD2 at terminal 105. Also, a change to a low voltage of VSS at terminal 103 corresponds to a change to a low voltage of VSS at terminal 105.

Level shifter 101 is a unidirectional in that a change in the voltage of terminal 105 will not cause a corresponding change in voltage of terminal 103. In addition, level shifter 101 includes two lines that cross domain boundary 104 (the line from the output of inverter 119 to the gate terminal of NFET 115 and the line from signal terminal 103 to the gate terminal of NFET 117).

FIG. 2 is a circuit diagram of another prior art level shifter. Level shifter 201 includes a resistor 208 coupled to a Domain 2 voltage supply rail 207 (at VDD2). Resistor 208 is connected to NFET 213, both of which are located in the second voltage domain (Domain 2). An output terminal 205 is connected to the source/drain terminal of NFET 213. The input terminal 203 is connected to the input of inverter 211, which is located in voltage domain 1 (Domain 1). The output of inverter 211 is coupled to the gate terminal of NFET 213. Level shifter only has one signal line (the signal line from the output of inverter 211 to the gate terminal of NFET 213) that crosses the domain boundary 204. However, a constant current flows through resister 208 when NFET 213 is conductive. This constant current flow consumes energy during operation.

What is needed is an improved level shifter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
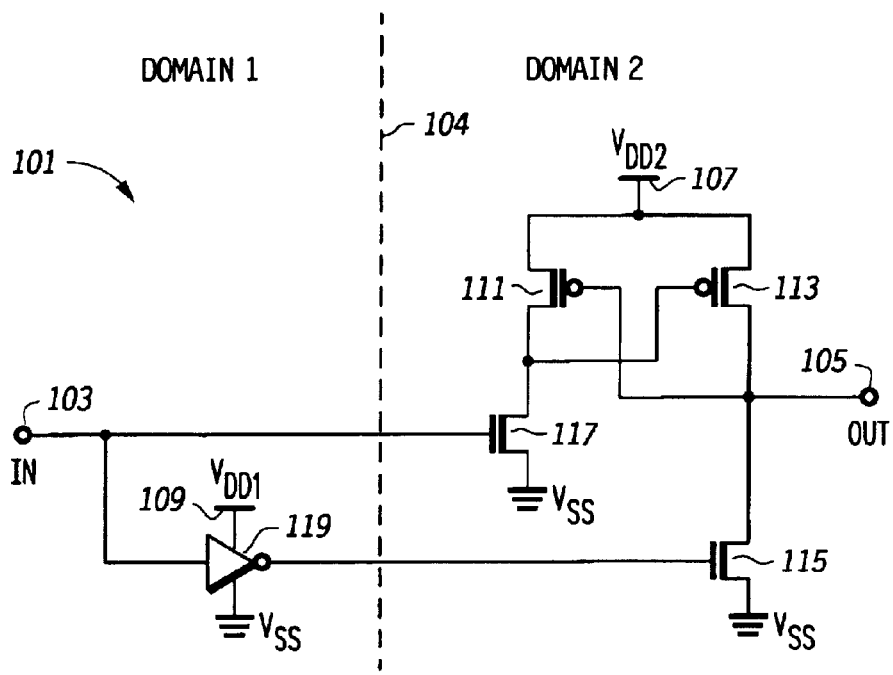
FIG. 1 is a circuit diagram of a prior art level shifter.
Figure 2:
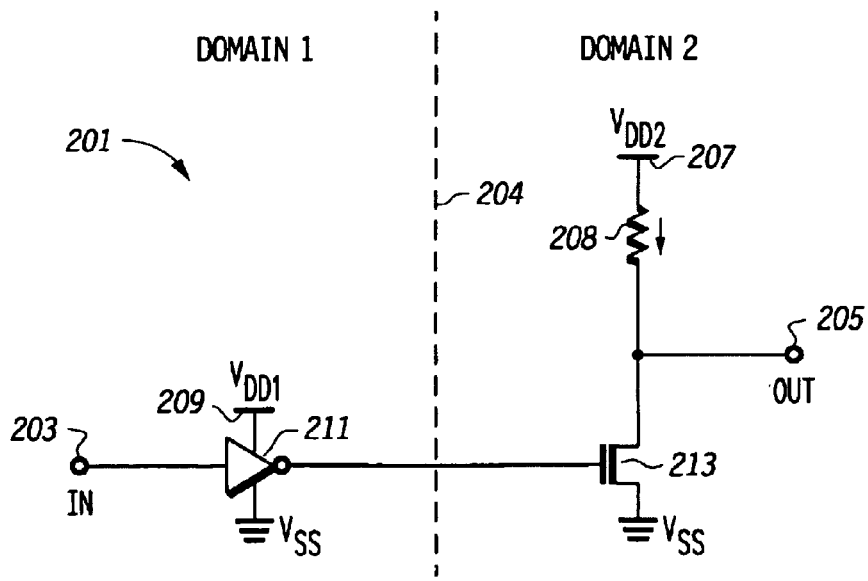
FIG. 2 is a circuit diagram of a prior art level shifter.
Figure 3:
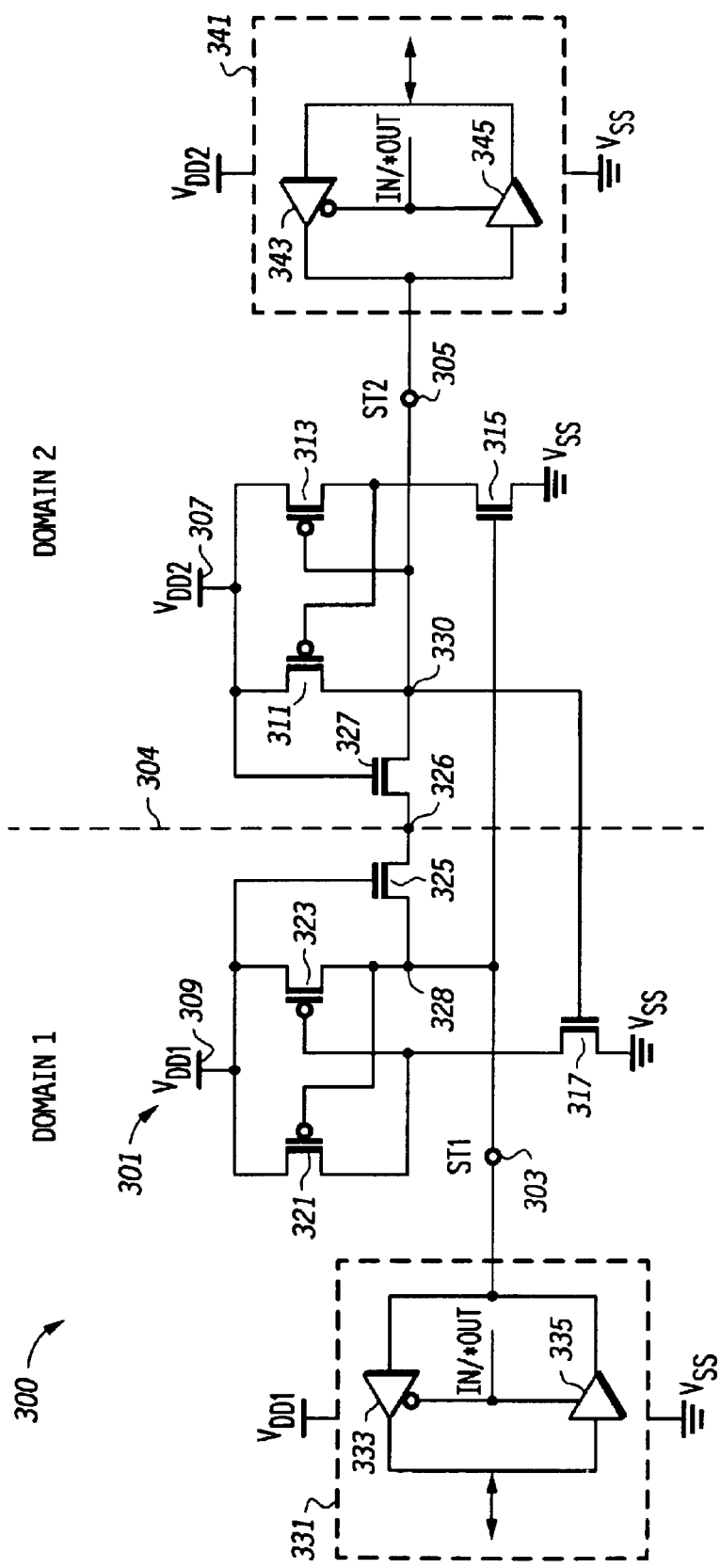
FIG. 3 is a circuit diagram of one embodiment of an integrated circuit including a level shifter according to the present invention.

FIG. 3 is a circuit diagram of one embodiment of an integrated circuit 300 including a level shifter 301 according to the present invention. Level shifter 301 includes PFETs 321 and 323 and NFETs 325 and 317 located in voltage domain 1 (Domain 1). Level shifter 301 also includes PFETs 311 and 313 and NFETs 327 and 315 located in voltage domain 2 (Domain 2). Source/drain terminals of PFETs 321 and 323 and the gate terminal of NFET 325 are connected to Domain 1 voltage supply rail 309 (at voltage VDD1) and a source/drain terminal of NFET 317 is connected to the VSS rail (at voltage VSS).

Sourced/drain terminals of PFETs 311 and 313 and the gate terminal of NFET 327 are connected to Domain 2 voltage supply rail 307 (at VDD2), and a source/drain terminal of NFET 315 is connected to the VSS rail.

Level shifter 301 includes a first signal terminal (ST1) 303 coupled to a circuit 331 of integrated circuit 300 located in Domain 1. Circuit 331 is powered at VDD1. Signals are conveyed between circuit 331 and level shifter 301 via terminal 303. Level shifter 301 includes a second signal terminal (ST2) 305 coupled to a circuit 341 of integrated circuit 300 which is located in Domain 2 and is powered at VDD2. Signals are conveyed between circuit 341 and level shifter 301 via terminal 305. In one embodiment, signal terminals 303 and 305 are locations in the signal lines between level shifter 301 and circuits 331 and 341, respectively.

Level shifter 301 is a non inverting level shifter in that a change in the voltage of terminal 303 from a low voltage (e.g. VSS) to a high voltage (e.g. VDD1) causes a corresponding change from a low voltage (e.g. VSS) at terminal 305 to a high voltage (e.g.VDD2) and a change in the voltage of terminal 303 from a high voltage to a low voltage causes a corresponding change in the voltage of terminal 305 from a high voltage to a low voltage. However, in other embodiments, level shifter 301 may be an inverting level shifter in that a change in the voltage of terminal 303 in one direction (e.g. low to high) causes a corresponding change in the voltage of terminal 305 in the opposite direction (e.g. high to low).

Level shifter 301 is a bi-directional level shifter in that a change in voltage of terminal 305 also causes a corresponding change in voltage of terminal 303. Accordingly, terminal 303 can be utilized as an input and terminal 305 can be utilized as an output or terminal 305 can be utilized as an input and terminal 303 can be utilized as an output.

In the embodiment shown, terminal 303 is coupled to circuit 331 and terminal 305 is coupled to circuit 341. In the embodiment shown, circuit 331 is capable of providing a signal to terminal 303 and receiving a signal from terminal 303. Also in the embodiment shown, circuit 341 is capable of receiving a signal from terminal 305 and providing a signal to terminal 305. In one embodiment, circuit 331 includes a processor (not shown) and circuit 341 includes an I/O pad (not shown). In another embodiment circuit 331 includes a peripheral or processor circuit (not shown) and circuit 341 includes a bi-directional bus (not shown).

In the embodiment shown, circuits 331 and 341 each include circuitry for directing the flow of a signal through level shifter 301. In the embodiment shown, circuit 331 includes tri-state buffers 333 and 335 which are oppositely controlled by an In/*Out signal to determine whether circuit 331 will provide a signal to terminal 303 or receive a signal from terminal 303. Circuit 341 also includes tristate buffers 343 and 345 which are oppositely controlled by the In/*Out signal to determine whether circuit 341 will provide a signal to terminal 305 or receive a signal from terminal 305. During the operation of circuit 300, level shifter 301 may be used to shift signals in either direction depending upon the state of the In/*Out signal. Other embodiments may include other circuitry/and or other operating protocol for determining the direction flow of a signal through level shifter 301.

Using a bi-directional level shifter may advantageously provide for a circuit with less signal lines crossing a domain boundary (e.g. 304), which may reduce routing congestion. Also, using a bi-directional level shifter may also allow for a reduction in circuitry in an integrated circuit.

In the embodiment shown, level shifter 301 can be utilized to upshift or downshift the voltage of a signal in either direction. For example, when terminal 303 is utilized as an input and terminal 305 is utilized as an output, level shifter 301 can operate where VDD1 is either greater or less than VDD2. Likewise, when terminal 305 is utilized as an input and terminal 303 is utilized as an output, level shifter 301 can operate where VDD1 is either greater than or less than VDD2. In the embodiment shown, PFET 323 is utilized to pull terminal 303 to VDD1 and PFET 311 is utilized to pull terminal 305 to VDD2. Accordingly, level shifter 301 is operable in a system where the supply voltages of Domain 1 and Domain 2 are independently variable. For example, level shifter 301 can be used where VDD1 and/or VDD2 is reduced during operation for the circuitry of Domain 1 and/or Domain 2 to operate in a low power mode.

A change in the voltage of terminal 303 from a low voltage (e.g. VSS) to a high voltage (e.g. VDD1) causes NFET 315 to become conductive, thereby pulling the gate terminal of PFET 311 to VSS making PFET 311 conductive. PFET 311 being conductive pulls terminal 305 to VDD2 and pulls the gate terminal of PFET 313 to VDD2. Terminal 303 going to a high voltage also causes PFET 321 to become non conductive. PFET 311 becoming conductive pulls the gate terminal of NFET 317 to VDD2, thereby making it conductive and pulling the gate terminal of PFET 323 to VSS (which makes PFET 323 conductive). Making PFET 323 conductive pulls terminal 303 to VDD1 via a conductive PFET 323.

Level shifter 301 also includes a current path from terminal 303 to terminal 305 that includes NFETs 325 and 327. When terminal 303 is initially at a low voltage (e.g. VSS), NFETs 325 and 327 are conducting to pull the voltage of terminal 305 to the low voltage (e.g. VSS) of terminal 303. When the voltage of terminal 303 changes to a high voltage, the voltage of terminal 305 is pulled toward the voltage of terminal 303 through conductive NFETs 325 and 327. This path through NFETs 325 and 327 may advantageously provide for reduced propagation delay from a change in the voltage at 303 to a change in the voltage of 305 (and vice versa).

If VDD1 is lower than VDD2, as the voltage of terminal 303 rises towards VDD1, the voltage at node 328 reaches the voltage of that is within the voltage threshold (of NFET 325) of the voltage (VDD1) of the control gate of NFET 325, thereby causing NFET 325 to become non conductive. When NFET 325 becomes non conductive at this time, current stops flowing through NFET 325 and 327. At this time, however, PFET 311 is conductive to "lock" the voltage of terminal 305 at VDD2. Because PFETs 323 and 311 are conductive when terminal 303 is at a high voltage and terminal 305 is at a high voltage, NFETs 325 and 327 being conductive would cause the voltage supply rails 309 and 307 to be coupled to each other. However, as stated above, as the voltage of terminal 303 approaches VDD1, NFET 325 becoming non conductive cuts off the flow of current in the path between VDD2 rail 307 and VDD1 rail 309.

If VDD1 is higher than VDD2, as the voltage of terminal 305 is pulled toward VDD2 from VSS, the voltage at node 330 approaches the voltage of that is within a voltage threshold (of NFET 327) of the voltage (VDD2) of control gate of NFET 327, thereby causing NFET 327 to become non conductive and cutting off the flow of current in the path from VDD1 rail 309 to VDD2 rail 307.

When the voltage of terminal 303 goes from a high voltage (e.g. VDD1) to a low voltage (e.g. VSS), the voltage at node 328 drops to a voltage less than the threshold voltage of NFET 325 from VDD1, thereby NFET 325 becomes conductive pulling node 326 low (and causing NFET 327 to be conductive). With NFETs 325 and 327 becoming conductive, terminal 305 is pulled to a low voltage though NFETs 327 and 325 and terminal 303 to VSS.

The voltage of terminal 303 going from a high voltage to a low voltage also makes NFET 315 non conductive and PFET 321 conductive. The voltage of terminal 305 going from a high voltage to a low voltage makes PFET 313 conductive and NFET 317 non conductive. PFET 313 becoming conductive makes PFET 311 non conductive. Making PFET 321 conductive makes PFET 323 non conductive.

Level shifter 301 operates in a similar manner when terminal 305 is utilized as an input and terminal 303 is utilized as an output with PFETs 311 and 313 and NFETS 327 and 315 operating like PFETs 323 and 321 and NFETs 325 and 317, respectively, (and vice versa) when terminal 303 is utilized as an input and terminal 305 is utilized as an output, as described above.

Figure 4:
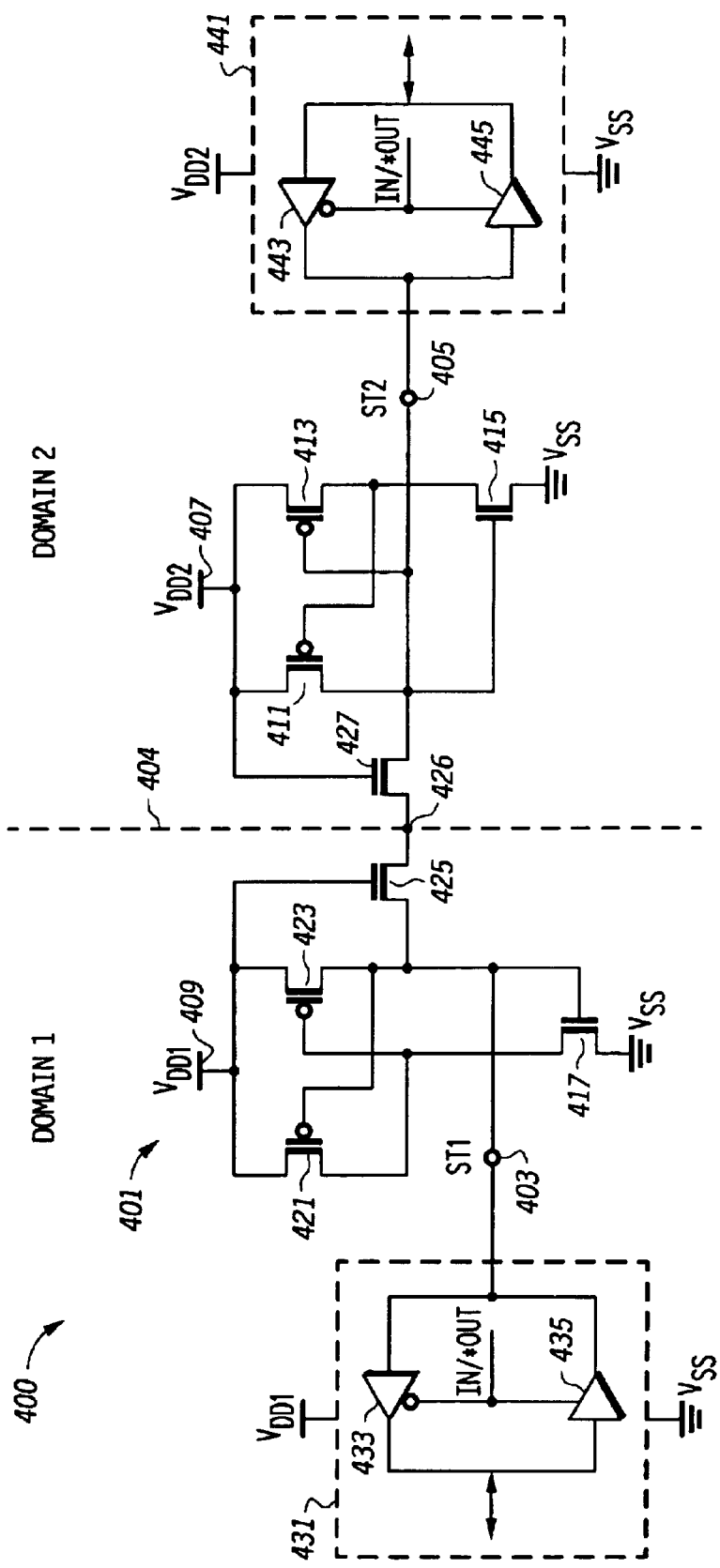
FIG. 4 is a circuit diagram of a another embodiment of an integrated circuit including a level shifter according to the present invention.

FIG. 4 shows another embodiment of an integrated circuit 400 including a level shifter 401 according to the present invention. Level shifter 401 includes PFETs 421 and 423 and NFETs 425 and 417 located in voltage domain 1 (Domain 1) of integrated circuit 400. Level shifter 401 also includes PFETs 411 and 413 and NFETs 427 and 415 located in voltage domain 2 (Domain 2) of integrated circuit 400. Source/drain terminals of PFETs 421 and 423 and the gate terminal of NFET 425 are connected to Domain 1 voltage supply rail 409 (at VDD1) and a source/drain terminal of NFET 417 is connected to a VSS rail. Sourced/drain terminals of PFETs 411 and 413 and the gate terminal of NFET 427 are connected to Domain 2 voltage supply rail 407 (at VDD2), and a source/drain terminal of NFET 415 is connected to the VSS rail.

Level shifter 401 includes a first signal terminal (ST1) 403 coupled to circuit 431 of integrated circuit 400 located in Domain 1. Circuit 431 is similar to circuit 331 of FIG. 3. Circuit 431 is powered at VDD1. Signals are conveyed between circuit 431 and level shifter 401 via terminal 403. Level shifter 401 includes a second signal terminal (ST2) 405 coupled to circuit 441 of integrated circuit 400 which is located in Domain 2 and is powered at VDD2. Circuit 441 is similar to circuit 341 of FIG. 3. Signals are conveyed between circuit 441 and level shifter 401 via terminal 405.

As with level shifter 301 of FIG. 3, level shifter 401 is a bi-directional level shifter where terminal 403 is operable as an input and terminal 405 is operable as an output or terminal 405 is operable as an input and terminal 403 is operable as an output. Furthermore, as with level shifter 301, level shifter 401 is operable in either direction where VDD1 is either greater or less than VDD2.

Level shifter 401 includes a current path between terminal 403 and terminal 405 that includes NFETs 425 and 427. As with NFETs 325 and 327 of FIG. 3, these NFETs are utilized to cut the flow of current between VDD1 rail 409 and VDD2 rail 407 (through conducting PFETs 423 and 411) when terminals 403 and 405 are at a high voltage.

Level shifter 401 is similar to level shifter 301 except that the gate terminal of NFET 417 is connected to signal terminal 403 and the gate terminal of NFET 415 is connected to signal terminal 405. With level shifter 301, the gate terminal of NFET 317 is connected (by a signal line that crosses domain boundary 304) to signal terminal 305 and the gate terminal of NFET 315 is connected (by a signal line that crosses domain boundary 304) to signal terminal 303. See FIG. 3. Accordingly, with level shifter 401, only one signal line 426 crosses domain boundary 404.

Providing a level shifter than includes only one signal line crossing a domain boundary may provide an integrated circuit with less routing congesting between voltage domains of the integrated circuit.

Figure 5:
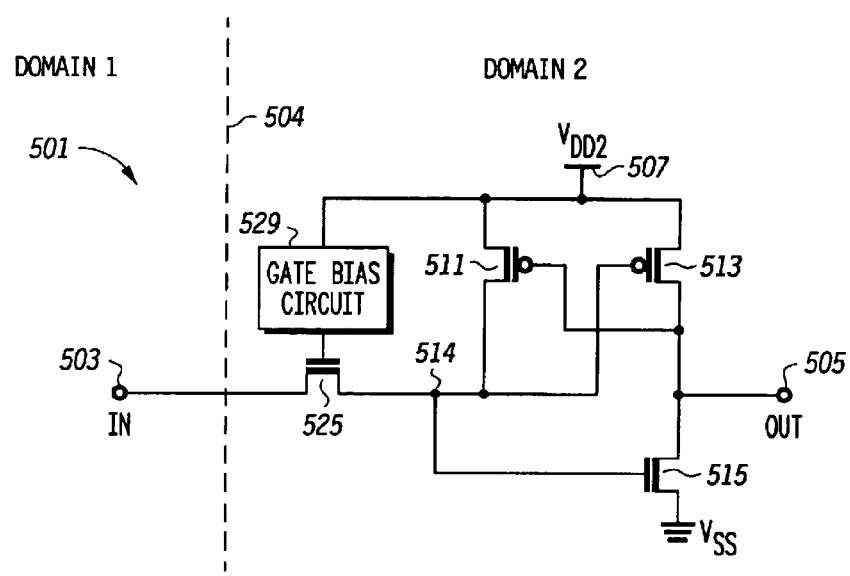
FIG. 5 is a circuit diagram of another embodiment of a level shifter according to the present invention.

FIG. 5 is a circuit diagram of another embodiment of a level shifter according to the present invention. Level shifter 501 includes PFETs 511 and 513, NFETs 515 and 525, and gate bias circuit 529 located in voltage domain 2 (Domain 2). Level shifter 501 is a unidirectional, inverting level shifter with terminal 503 serving as an input terminal and terminal 505 serving as an output terminal.

Level shifter 501 includes a gate bias circuit 529 that sets the voltage of the gate terminal of NFET 525 to a voltage that is less than VDD1 plus the voltage threshold of NFET 525 but more than the threshold voltage of NFET 525 plus the threshold voltage of NFET 515. In one embodiment, circuit 529 includes a NFET having a source/drain terminal and a gate terminal connected to VDD2 rail 507 and a second source/drain terminal connected to the gate terminal of NFET 525.

When the voltage of terminal 503 changes from a low voltage (e.g. VSS) to a high voltage (e.g. VDD1), NFET 515 becomes conductive to pull the voltage of terminal 505 to VSS and to make PFET 511 conductive. Making PFET 511 conductive pulls node 514 to VDD2 and makes PFET 513 non conductive.

As the voltage of terminal 503 reaches a voltage of one threshold voltage from the voltage of the gate terminal of NFET 525, NFET 525 becomes non conductive, thereby cutting off the flow of current in a path between a voltage supply rail (not shown in FIG. 5) of domain 1 and the voltage supply rail 507 (at VDD2) of Domain 2. Cutting off the flow of current may advantageously reduce power when terminal 503 is at a high voltage state. In other embodiments, level shifter 501 may include additional transistors in the supply path for cutting off the flow of current. In one embodiment, the number of transistors is dependent upon the difference in voltage between VDD2 and VDD1 as well as the threshold voltages of the transistors.

When terminal 503 changes from a high voltage to a low voltage, NFET 525 becomes conductive to make NFET 515 non conductive and to make PFET 513 conductive to pull terminal 505 to VDD2. Pulling terminal 505 to VDD2 makes PFET 511 non conductive.

With the level shifter of FIG. 5, only one signal line crosses domain signal boundary 504.

In some embodiments of the level shifters of the FIGS. 3–5, the transistor bodies of the NFETs and PFETs shown are connected to their source terminals. In one embodiment of level shifter 301, the transistor body of NFET 325 is connected to node 328 and the transistor body of NFET 327 is connected to node 330. In other embodiments, the transistor bodies of the NFETs are connected to the VSS rail and the transistor bodies of the PFETs are connected to the voltage rail of their domain voltage supply.

Those of skill in the art will appreciate that, based upon the teachings, the embodiments shown and described herein may include further modifications. Level shifters 301, 401, and 501 may have other configurations. For example, level shifters 301 and 401 may be modified to be inverting level shifters and level shifter 501 may be modified to be a non inverting level shifter. Also, level shifters 301, 401, and 501 may be implemented with other types of transistors.

In one embodiment, an integrated circuit includes a bi-directional level shifter. The bi-directional level shifter includes first signal terminal operable as an input and an output. When being operable as an input, the first signal terminal receives a first signal compatible with a first voltage domain of the integrated circuit. When being operable as an output, the first signal terminal provides a shifted signal compatible with the first voltage domain of the integrated circuit. The bi-directional level shifter includes a second signal terminal operable as an output and an input. When being operable as an output, the second signal terminal provides a shifted signal compatible with a second voltage domain of the integrated circuit. When being operable as an input, the second signal terminal receives a second signal compatible with the second voltage domain of the integrated circuit. The level shifter further including level shift circuitry coupled between the first signal terminal and the second signal terminal. The level shift circuitry translates the first signal compatible with the first voltage domain to the shifted signal compatible with the second voltage domain when the first signal terminal is operable as an input. The level shift circuitry translates the second signal compatible with the second voltage domain to the shifted signal compatible with the first voltage domain when the second signal terminal is operable as an input. In still a further embodiment, the level shift circuitry includes at least one current cut-off transistor. Responsive to being non conductive, the at least one current cut-off transistor operates to cut off current flowing in a current path between a first voltage domain voltage supply and second voltage domain voltage supply.

In another embodiment, a method includes providing a first signal to a first signal terminal of a level shifter. The first signal is compatible with a first voltage domain. In response to the providing the first signal, the level shifter provides at a second signal terminal of the level shifter a shifted signal compatible with a second voltage domain. The method also includes providing a second signal to the signal terminal of the level shifter. the second signal is compatible with the second voltage domain. In response to the providing the second signal, the level shifter provides at the first signal terminal a shifted signal compatible with a first voltage domain.

In another embodiment, an integrated circuit includes a level shifter. The level shifter includes a first signal terminal configured to receive a first signal compatible with a first voltage domain of the integrated circuit. The level shifter includes a second signal terminal configured to output a shifted signal compatible with a second voltage domain of the integrated circuit. The second voltage domain includes a power supply voltage that is higher than a power supply voltage of the first voltage domain. The level shifter also includes level shift circuitry located in the second voltage domain. The level shift circuitry translates the first signal received via a signal line from the first voltage domain to the shifted signal and including means for cutting off current of a current path including the signal line sourced by a second voltage domain supply when the signal line is at high voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit with a bi-directional level shifter, the bi-directional level shifter comprising:
    a first signal terminal operable as an input and an output, wherein when being operable as an input, the first signal terminal receives a first signal compatible with a first voltage domain of the integrated circuit and wherein when being operable as an output, the first signal terminal provides a shifted signal compatible with the first voltage domain of the integrated circuit;
    a second signal terminal operable as an output and an input, wherein when being operable as an output, the second signal terminal provides a shifted sign compatible with a second voltage domain of the integrated circuit and wherein when being operable as an input, the second signal terminal receives a second signal compatible with the second voltage domain of the integrated circuit; and
    level shift circuitry coupled between the first signal terminal and the second signal terminal, the level shift circuitry translating the first signal compatible with the first voltage domain to the shifted signal compatible with the second voltage domain when the first signal terminal is operable as an input, the level shift circuitry translating the second signal compatible with the second voltage domain to the shifted signal compatible with the first voltage domain when the second signal terminal is operable as an input;
    wherein the level shift circuitry further includes at least one current cut-off transistor, wherein responsive to being non conductive, the at least one current cut-off transistor operates to cut off current flowing in a current path between a first voltage domain voltage supply and second voltage domain voltage supply;
    wherein the at least one current cut-off transistor includes a first cut-off transistor disposed within the first voltage domain and a second transistor disposed within the second voltage domain.

2. The integrated circuit of claim 1 wherein the level shifter has only one signal line that crosses a domain boundary between the first voltage domain and the second voltage domain.

3. The integrated circuit of claim 1, wherein the level shift circuit is characterized as bidirectional level shift circuitry.

4. An integrated circuit with a bi-directional level shifter, the bi-directional level shifter comprising:
    a first signal terminal operable as an input, wherein when being operable as an input, the first signal terminal receives a first signal compatible with a first voltage domain of the integrated circuit and wherein when being operable as an output, the first signal terminal provides a shifted signal compatible with the first voltage domain of the integrated circuit;
    a second signal terminal operable as an output and an input, wherein when being operable as an output, the second signal terminal provides a shifted signal compatible with a second voltage domain of the integrated circuit and wherein when being operable as an input, the second signal terminal receives a second signal compatible with the second voltage domain of the integrated circuit; and
    level shift circuitry coupled between the first signal terminal and the second signal terminal, the level shift circuitry translating the first signal compatible with the first voltage domain to the shifted signal compatible with the second voltage domain when the first signal terminal is operable as an input, the level shift circuitry translating the second signal compatible with the second voltage domain to the shifted signal compatible with the first voltage domain when the second signal terminal is operable as an input;
    wherein the level shift circuitry further includes at least one current cut-off transistor, wherein responsive to being non conductive, the at least one current cut-off transistor operates to cut off current flowing in a current path between a first voltage domain voltage supply and second voltage domain voltage supply;
    wherein the at least one current cut-off transistor includes first transistor and a second transistor, the first transistor being disposed within the first voltage domain and having a control terminal coupled to a first voltage domain voltage supply, and a current terminal, and the second transistor being disposed within the second voltage domain and having a control terminal coupled to a second voltage domain voltage supply and a current terminal coupled to the current terminal of the first transistor.

5. The integrated circuit of claim 4, wherein the first transistor is characterized as in NFET and the second transistor is characterized as an NFET.

6. The integrated circuit of claim 4, wherein the level shift circuitry is characterized as bidirectional level shift circuitry.

7. An integrated circuit with a bi-directional level shifter, the bi-directional level shifter comprising:
    a first signal terminal operable as an input and an output, wherein when being operable as an input, the first signal terminal receives a first signal compatible with a first voltage domain of the integrated circuit and wherein when being operable as an output, the first signal terminal provides a shifted signal compatible with the first voltage domain of the integrated circuit;
    a second signal terminal operable as an output and an input, wherein when being operable as an output, the second signal terminal provides a shifted signal compatible with a second voltage domain of the integrated circuit and wherein when being operable as an input, the second signal terminal receives a second signal compatible with the second voltage domain of the integrated circuit; and level shift circuitry coupled between the first signal terminal and the second signal terminal, the level shift circuitry translating the first signal compatible with the first voltage domain to the shifted signal compatible with the second voltage domain when the first signal terminal is operable as an input, the level shift circuitry translating the second signal compatible with the second voltage domain to the shifted signal compatible with the first voltage domain when the second signal terminal is operable as an input;

wherein the level shift circuitry comprises:
a current path between the first signal terminal and the second signal terminal, the current path including a first transistor and a second transistor, the first transistor being disposed within the first voltage domain and having a first current terminal coupled to the first signal terminal, a control terminal coupled to a first voltage domain voltage supply, and a second current terminal, and the second transistor being disposed within the second voltage domain and having a first current terminal coupled to the second signal terminal, a control terminal coupled to a second voltage domain voltage supply, and a second current terminal coupled to the second current terminal of the first transistor.

8. The integrated circuit of claim 7 wherein the current path is the only current path of the level shift circuitry to cross a domain boundary between the first voltage domain and the second voltage domain.

9. The integrated circuit of claim 7 wherein the level shift circuitry further comprises:
a first transistor located in the first voltage domain and having a first current terminal coupled to the first voltage domain voltage supply and a second current terminal coupled to the current path;
a second transistor located in the first voltage domain and having a first current terminal coupled the first voltage domain voltage supply and a second current terminal coupled to a control terminal or the first transistor, and a control terminal coupled to the current path;
a third transistor located in the second voltage domain and having a first current terminal coupled to the second voltage domain voltage supply and a second current terminal coupled to the current path;
a fourth transistor located in the second voltage domain and having first current terminal coupled the second voltage domain voltage supply, a second current terminal coupled to the control terminal of the third transistor, and a control terminal coupled to the current path.

10. The integrated circuit of claim 7, wherein the level shift circuitry is characterized as bidirectional level shift circuitry.

11. An integrated circuit with a bi-directional level shifter, the bi-directional level shifter comprising:
a first signal terminal operable as an input and an output, wherein when being operable as an input, the first signal terminal receives a first signal compatible with a first voltage domain of the integrated circuit and wherein when being operable as an output, the first signal terminal provides a shifted signal compatible with the first voltage domain of the integrated circuit;

a second signal terminal operable as an output and an input, wherein when being operable as an output, the second signal terminal provides a shifted sign compatible with a second voltage domain of the integrated circuit and wherein when being operable as an input, the second signal terminal receives a second signal compatible with the second voltage domain of the integrated circuit; and level shift circuitry coupled between the first signal terminal and the second signal terminal, the level shift circuitry translating the first signal compatible with the first voltage domain to the shifted signal compatible with the second voltage domain when the first signal terminal is operable as an input, the level shift circuitry translating the second signal compatible with the second voltage domain to the shifted signal compatible with the first voltage domain when the second signal terminal is operable as an input;

wherein the integrated circuit further comprises:
a first circuit coupled to the first signal terminal, the first circuit including circuitry to enable the first circuit to receive the shifted signal from the first signal terminal and circuitry to enable the first circuit to provide the first signal to the first signal terminal;
a second circuit coupled to the second signal terminal, the second circuit including circuitry to enable the second circuit to receive the shifted signal from the second signal terminal and circuitry to enable the second circuit to provide the second signal to the second signal terminal.

12. The integrated circuit of claim 11, wherein the level shift circuitry is characterized as bidirectional level shift circuitry.

13. An integrated circuit with a bi-directional level shifter, the bi-directional level shifter comprising:
a first signal terminal operable as an input and an output, wherein when being operable as an input, the first signal terminal receives a first signal compatible with a first voltage domain of the integrated circuit and wherein when being operable as an output, the first signal terminal provides a shifted signal compatible with the first voltage domain of the integrated circuit;
a second signal terminal operable as an output and an input, wherein when being operable as an output, the second signal terminal provides a shifted sign compatible with a second voltage domain of the integrated circuit and wherein when being operable as an input, the second signal terminal receives a second signal compatible with the second voltage domain of the integrated circuit; and
level shift circuitry coupled between the first signal terminal and the second signal terminal, the level shift circuitry translating the first signal compatible with the first voltage domain to the shifted signal compatible with the second voltage domain when the first signal terminal is operable as an input, the level shift circuitry translating the second signal compatible with the second voltage domain to the shifted signal compatible with the first voltage domain when the second signal terminal is operable as an input;

wherein the level shift circuitry further comprises:
a first transistor located in the first voltage domain and having a first current terminal coupled to a first voltage domain voltage supply and a second current terminal coupled to the first signal terminal;
a second transistor located in the first voltage domain and having a first current terminal coupled the first voltage domain voltage supply, a second current terminal coupled to the control terminal of the first transistor, and a control terminal coupled to the first signal terminal;

a third transistor located in the second voltage domain and having a first current terminal coupled to a second voltage domain voltage supply and a second current terminal coupled to the second signal terminal;

a fourth transistor located in the second voltage domain and having a first current terminal coupled the second voltage domain voltage supply, a second current terminal coupled to the control terminal of the third transistor, and a control terminal coupled to the second signal terminal.

14. The integrated circuit of claim 13, wherein the level shift circuitry is characterized as bidirectional level shift circuitry.

15. A method comprising:

providing a first signal to a first signal terminal of a level shifter, the first signal compatible with a first voltage domain, wherein in response to the providing the first signal, the level shifter provides at a second signal terminal of the level shifter a shifted signal compatible with a second voltage domain; and providing a second signal to the signal terminal of the level shifter, the second signal compatible with the second voltage domain, wherein in response to the providing the second signal, the level shifter provides at the first signal terminal a shifted signal compatible with a first voltage domain;

cutting off current of a current path of the level shifter between a first voltage domain voltage supply and a second voltage domain voltage supply when the voltage at the first signal terminal is at a high voltage;

enabling circuitry of a first circuit coupled to the first signal terminal and located in the first voltage domain to provide the first signal to the first signal terminal;

enabling circuitry of the first circuit to receive the shifted signal from the second signal terminal.

16. The method of claim 15 wherein the cutting off a current path further includes making non conductive a transistor of a first transistor and second transistor, wherein the first transistor is located in the first voltage domain and has a control terminal coupled to the first voltage domain voltage supply and the second transistor is located in the second voltage domain and has a control terminal coupled to a second voltage domain voltage supply, wherein the first transistor is made non conductive to cut off the current path when the first voltage domain voltage supply is lower than the voltage of the second voltage domain voltage supply and the second transistor is made non conductive when a voltage of the second voltage domain voltage supply is lower than a voltage of the first voltage domain voltage supply.

17. An integrated circuit with a level shifter, the level shifter comprising:

a first signal terminal configured to receive a first signal compatible with a first voltage domain of the integrated circuit;

a second signal terminal configured to output a shifted signal compatible with a second voltage domain of the integrated circuit, wherein the second voltage domain includes a power supply voltage that is higher than a power supply voltage of the first voltage domain; and level shift circuitry located in the second voltage domain, the level shift circuitry translating the first signal received via a signal line from the first voltage domain to the shifted signal and including means for cutting off current of a current path including the signal line sourced by a second voltage domain supply when the signal line is at high voltage;

wherein the means for cutting off current includes at least one transistor coupled between the second voltage domain supply and the signal line;

wherein the at least one transistor includes a first transistor having a current terminal coupled to the signal line and a control terminal coupled to a bias circuit for maintaining a bias voltage on the control terminal, wherein the bias voltage is in a range between the power supply voltage plus a threshold of the first transistor and two transistor threshold voltages including the threshold voltage of the first transistor.

18. The integrated circuit of claim 17, wherein the at least one transistor includes an NFET.

19. The integrated circuit of claim 17, wherein the bias circuit includes a conductor coupled to a second voltage domain supply.

20. The integrated circuit of claim 17, wherein the level shift circuitry is characterized as bidirectional level shift circuitry.

21. A method comprising:

providing a first signal to a first signal terminal of a level shifter, the first signal compatible with a first voltage domain, wherein in response to the providing the first signal, the level shifter provides at a second signal terminal of the level shifter a shifted signal compatible with a second voltage domain; and providing a second signal to the signal terminal of the level shifter, the second signal compatible with the second voltage domain, wherein in response to the providing the second signal, the level shifter provides at the first signal terminal a shifted signal compatible with a first voltage domain;

cutting off current of a current path of the level shifter between a first voltage domain voltage supply and a second voltage domain voltage supply when the voltage at the first signal terminal is at a high voltage;

wherein the cutting off a current path further includes making non conductive a transistor of a first transistor and a second transistor, wherein the first transistor is located in the first voltage domain and has a control terminal coupled to the first voltage domain voltage supply and the second transistor is located in the second voltage domain and has a control terminal coupled to a second voltage domain voltage supply, wherein the first transistor is made non conductive to cut off the current path when the first voltage domain voltage supply is lower than the voltage of the second voltage domain voltage supply and the second transistor is made non conductive when a voltage of the second voltage domain voltage supply is lower than a voltage of the first voltage domain voltage supply.

\* \* \* \* \*

UNITED STATES PATENT AND TRADEMARK OFFICE
CERTIFICATE OF CORRECTION

PATENT NO. : 6,954,100 B2 Page 1 of 1
APPLICATION NO. : 10/660847
DATED : October 11, 2005
INVENTOR(S) : Shivraj G. Dharne It is certified that error appears in the above-identified patent and that said Letters Patent is hereby corrected as shown below:

In Column 8, Line 9, Claim No. 4:

Change "operable as an input, wherein" to --operable as an input and an output, wherein--

In Column 10, Line 45, Claim No. 13:

Change "shifted sign" to --shifted signal--

Signed and Sealed this

Thirteenth Day of May, 2008

JON W. DUDAS
*Director of the United States Patent and Trademark Office*